United States Patent [19]

Le Grelle

[11] 4,110,917
[45] Sep. 5, 1978

[54] ELECTRONIC EXPERIMENTING KIT

[75] Inventor: Guy Oscar Le Grelle, Borgerhout, Belgium

[73] Assignee: Xaverius College, Borgerhout, Belgium

[21] Appl. No.: 771,590

[22] Filed: Feb. 24, 1977

[30] Foreign Application Priority Data

Feb. 26, 1976 [FR] France .................. 76 05354

[51] Int. Cl.² ........................................... G09B 23/18
[52] U.S. Cl. ................................ 35/19 A; 339/17 CF
[58] Field of Search .............. 35/19 A; 339/17 CF; 361/403; 324/158 F

[56] References Cited

U.S. PATENT DOCUMENTS

| 3,877,064 | 4/1975 | Scheingold | 339/17CF X |
| 3,982,159 | 9/1976 | Dennis | 361/403 |

FOREIGN PATENT DOCUMENTS

| 279,936 | 3/1970 | Austria | 35/19 A |
| 916,838 | 1/1963 | United Kingdom | 35/19 A |
| 1,130,959 | 10/1968 | United Kingdom | 35/19 A |

Primary Examiner—Harland S. Skogquist
Attorney, Agent, or Firm—William Anthony Drucker

[57] ABSTRACT

In an electronic experimenting kit an insulating base is provided on the one surface thereof with two rims and between said rims with grooves inside which are mounted conductors. Electronic components are each mounted on a plate with the terminals thereof connected to conductors mounted on said plate. The rims are provided with grooves into which the plates are slid by the ends thereof. The plates are retained in position by springs which also provide the electrical connection between a base-mounted conductor and a plate-mounted conductor.

5 Claims, 4 Drawing Figures

U.S. Patent     Sept. 5, 1978     4,110,917
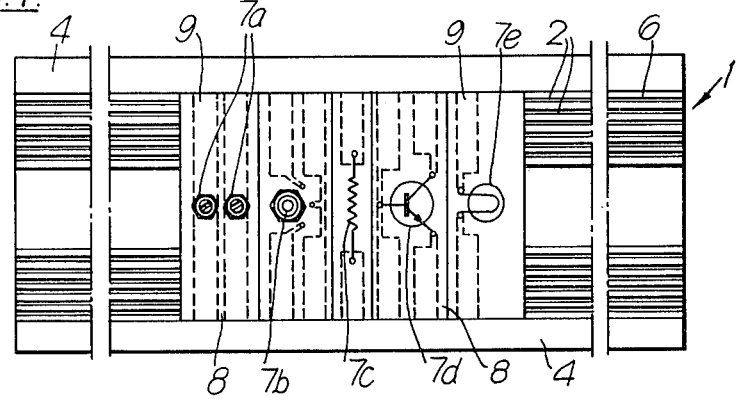
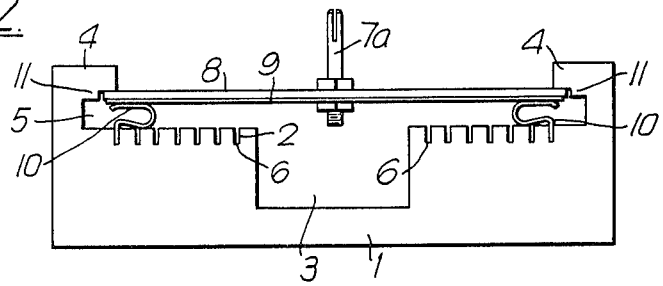
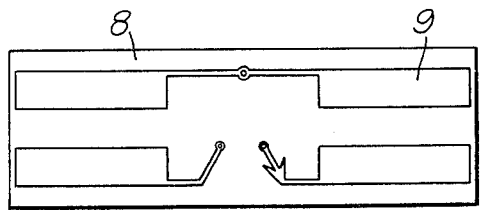
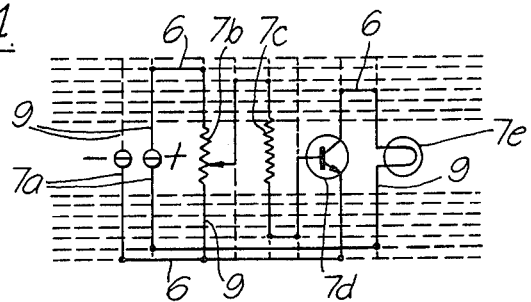

ELECTRONIC EXPERIMENTING KIT

This invention relates to an electronic experimenting kit of the kind which comprises:
a base;
a number of conductors mounted on said base, said conductors being electrically insulated relative to one another, extending substantially in parallel relationship with one another and being accessible from the one major face of the base;
a number of electronic components having connecting terminals;
a number of plates, each component being so mounted on a plate that the terminals thereof are electrically insulated from one another;
at least two conductors so mounted on each plate that they are electrically insulated from one another, each electronic component terminal on a plate being electrically connected to one of the conductors mounted on the plate;
means to removably fasten each plate on the base, and
means to provide a disconnectable contact between one base-mounted conductor and one plate-mounted conductor.

Such an electronic experimenting kit has been described in French Pat. No. 1,299,772. In such a kit, the base-mounted conductors are mounted in elongated recesses which lie in line in a plurality of rows and a plurality of parallel columns. Such conductors that form contact members, are made from a resilient material which conducts electricity, and they comprise two parts between which a pin can be inserted. The means for fastening the plates to the base are comprised of pins, each plate-mounted conductor being provided at the end thereof with such a pin at a right angle to the plate. Said pins are engageable through apertures in the base, between parts of those conductors mounted inside said base recesses. In one and the same conductor there can be inserted two pins to be electrically connected, the electronic components mounted on said plates, thus being connected together.

With such a kit however, the contact possibilities between the electronic components are very limited. Indeed those pins connecting a plate-mounted conductor to a base-mounted conductor are integral with the plate, with the result that various pins mounted on one and the same plate have an unchanging determined position relative to one another. Consequently when one plate-mounted pin is inserted into a base-mounted conductor, the other pin or pins may only be inserted in that conductor facing same on the base. This is the reason why the kit further comprises besides those plates fitted with electric components, wires provided with pins at the ends thereof to connect some conductors mounted on said base.

The construction of such a kit is rather intricate and the assembly of a particular electronic circuit or network is rather difficult and intricate.

The U.S. Pat. No. 3,877,064 also discloses a device for connecting an electronic component to conductors mounted on a base. In this case however a construction kit is not concerned but rather only the mounting of an integrated circuit on a printed base. The means for fastening the integrated circuit plate to the base comprise a hollow rim arranged on the base all around the circumference thereof, and a cover which is fastened with screws on said rim. The outermost edges of the plate are retained in position between the hollow rim or clamping means mounted on said hollow rim, and the cover. The plate has thus to be positioned before positioning the cover.

The means for providing the electric contact between a conductor mounted on the printed circuit plate and a base-mounted conductor are comprised of springs mounted inside the hollow rim and projecting outside said rim through openings therein. Said rim is thus provided with a plurality of openings which make the construction thereof more complex. The base-mounted conductors have to extend down to below the base as the springs inside said rim should contact said conductors. This requires the rim to be separate from the base. Not only is the kit construction very complex but here also the connection possibilities are very limited. Indeed when a spring contacts a plate-mounted conductor, the other spring end can only contact some particular base-mounted conductor as the spring has a well-determined position relative to the base. When using a plurality of plates with electronic components, the assembly of various electronic circuits would be quite difficult.

The use of electrical-contact springs is also known from U.S. Pat. No. 3,107,319. In the device as disclosed in said patent, the electronic components are not mounted on small plates and the springs are not separate from the components. Even if this device is rather simple, it does not allow the connection of an electronic component terminal to any one of the conductors mounted on the base. This device cannot be used consequently as electronic construction kit.

In other known prior art construction kits, the electronic component terminals mounted on the plates are connected directly for instance through bolts and nuts, to conductors which are mounted on the base. Said bolts and nuts not only comprise the electrical-contact means but also the means for fastening the plate to the base. The mounting of the plates on the base requires a lot of time. The mounting could be faster if use would be made, instead of bolts and nuts, of spiral springs which are so to say screwed through openins going through the plate and the base. As in such kits, the plates are not provided with conductors, the location of the electrical contact relative to the plate is thus well-defined. When an electronic component terminal is contacted with a base-mounted conductor, the other component terminal should necessarily contact another well-determined conductor on the base. To make it possible to assemble any electronic circuit with such devices, the base comprises two conductor sets, one on each side, the conductors from both sets crossing one another, and means to connect any conductor from the first set to any conductor from the second set. The construction and use of said device are consequently not very simple.

It is an object of the invention to provide an electronic experimenting kit of this kind which is easier and cheaper to manufacture, while allowing an easier and faster assembly of some particular electric circuit or network.

For this purpose in an electronic experimenting kit of the kind referred to above, the means for fastening the plates to the base comprise:
two rims mounted on the base on each side of the conductor set also mounted on said base and extending substantially in parallel relationship thereto, each such rim having a groove on the side thereof facing the opposite rim, each plate being receivable with both opposite ends thereof in the grooves provided in both said opposite rims, the plate length being longer than the spacing between those rim portions which lie farther away from the base than the grooves, but equal at the most to the sum of said spacing and the depth of a groove and or of the deepest groove when the grooves have different depths, the plate-mounted conductors being so arranged that they cross the base-mounted conductors when said plates are engaged with the end thereof inside the grooves provided in the base rims;

spring-action conductor elements which are completely independent from the base and the plates, said elements being designed for wedging between the base and each plate to press said plates against the rims by moving the plates away from the base and for contacting a plate-mounted conductor and a base-mounted conductor, said elements thus forming said electrical contact between any one of the conductors mounted on a plate and any conductor of a least one conductor set mounted on the base.

In a particular embodiment of the invention, the base has grooves in one major face thereof, each conductor mounted on said base being mounted in one such groove.

In a preferred embodiment of the invention, both rims are provided with a stop arranged in the groove on that groove side farthest away from the base, the spacing between both stops in the opposite grooves being substantially equal to the length of a plate, the groove width being larger than the plate thickness in such a way that said plates are slidable between the stop and the opposite groove wall.

In a particularly advatageous embodiment of the invention, the base is of rectangular shape and both the rims provided with a groove and the base-mounted conductors extend over substantially the whole base length.

Other details and features of the invention will be apparent from the description given below by way of non-limitative example and with reference to the accompanying drawings, in which:

FIG. 1 is a plan view of an electronic experimenting kit according to the invention used to assemble an electronic circuit comprising a light control.

FIG. 2 is an elevation of the kit shown in FIG. 1 but drawn to a larger scale.

FIG. 3 is an underplan view of a plate used in the kit as shown in the preceding figures.

FIG. 4 shows the wiring diagram of the electronic circuit formed with the kit as shown in FIG. 1, those conductor portions which are not used in the circuit being shown in phantom line.

In the various figures the same reference numerals pertain to similar elements.

The electronic experimenting kit as shown in the figures comprises a base 1 of insulating material. Said base is formed by a strip of extruded plastic material. Said base is wider than it is long. It is provided on a major face with two sets of seven narrow grooves 2 as well as with a wider and deeper groove 3 between both sets. The grooves 2 and 3 extend in parallel relationship with one another along the lengthwise direction of base 1.

On both outermost edges of said major face of base 1 are arranged two rims 4. Said rims 4 which extend throughout the base length have on their sides facing one another that is the side facing the grooves 2, a groove 5. Said groove 5 can extend down to said major face of base 1 as shown in the figures. In such a case, the rim 4 has an inverted-L shape in cross-section. The rims 4 are also made from plastic material and are integral with base 1. Said rims 4 can be extruded together with base 1.

Inside each groove 2 is mounted a conductor 6. Said conductor is a metal strip with a width equal to the width of a groove 2, that is from 0.5 to 1 mm. Said strip is glued to the groove bottom. Access can consequently be gained to each conductor 6 through groove 2 from that surface of base 1 which is provided with said grooves 2.

The experimenting kit further comprises a number of electronic components 7 and the same number of plates of insulating material, one component 7 being mounted on each plate 8. "Electronic component" should be construed here in the widest meaning thereof. Said component can be as well a pair of pins, a plug, a lamp, a switch, a resistor, a transistor or a capacitor.

The number of electronic components 7 and plates 8 shown in the figure corresponds to the number required for assembling a particular electronic circuit, for instance a light control. It is clear that the kit can comprise other electronic components mounted on plates to thus allow the assembly of other electronic circuits which comprise more or other electronic components than the electronic components as shown in the accompanying drawings.

To build the light control as shown in the figures, five components 7 are required. Component 7a is comprised of two pins which fit in a plug not shown in the drawings and which is connected to a source of 9 volt D.C. Component 7b is a potentiometer with a resistance of 10,000 ohms. Component 7c is a resistor with a resistance of 22,000 ohms. Component 7d is a transistor of BC 548 A type and component 7e is a lamp with a voltage of 6 volts and a current of 50 milli-amperes.

The plates 8 are also made from an electrically insulating plastic material. Said plates are of rectangular shape and have a width which is a function of the size of the electric component 7 mounted thereon. Each plate 8 is provided on one side thereof with as many conductors 9 as the component 7 mounted thereon has connecting terminals. Each connecting terminal is moreover soldered to said conductors 9. Said conductors 9 are comprised of metal strips glued to the surface of plate 8 or fastened thereon by the means used for forming printed circuits. Said conductors 9 extend along the lengthwise direction of the plate 8. Depending on the case considered, said conductors extend from one side relative to the component 7 to the one end of the plate or on both sides relative to the component 7, that is substantially over the whole length of the plate 8.

In FIG. 3 is shown the surface on which are mounted the conductors 9 of a plate 8, more particularly a plate bearing a transistor with three terminals. The electronic component 7 can be mounted as well on that plate side bearing the conductors 9 as on the other side, or even on both sides. Said components 7 can enter partly the groove 3 in the base which is provided for this purpose. Said components 7 are fastened to the plate 8 thereof due to the terminals thereof being soldered to the conductor 9 on said plate. In some cases, the fastening may be made by means of nuts threaded on a portion of the component, said component then going through the plate.

The thickness of the plate 8 is smaller than the width of grooves 5.

Each plate 8 is removably mounted on the base 1 by introducing both ends of said plate in the grooves 5 of rims 4 and by arranging between plate 8 and base 1, at least two springs 10. Actually the springs 10 are first located and then the plate 8 is introduced. The length of each plate 8 is longer than the spacing between those portions of rims 4 which are farther away from base 1 than the groove 5, but it is equal to or shorter than the sum of said spacing and the depth of the deepest groove 5. As in the kit shown in the figures, both grooves 5 have the same depth, and either one of said grooves can be considered. By compressing the spring nearest the deepest groove 5, the one end of the plate is introduced as deep as possible in said groove 5. The other end of plate 1 can then be introduced between both rims 4 opposite the other groove 5 by compressing that spring nearest said other groove 5. After thus locating the plate 8 between both rims 4, the plate 8 is slid over the springs along the lengthwise direction of the plate until that plate end which is still free enters the last-mentioned groove 5 but without the other plate end coming out of the other groove 5. In this way, both ends of plate 8 each lie inside a groove 5. Due to the action of springs 10, said ends are positively pushed against that portion of rims 4 which is farther away from base 1 than said grooves 5, thus avoiding any accidental displacement of plate 8. A stop 11 is provided about at half-depth inside each groove 5 on that surface farthest away from base 1 of said groove. The spacing between the stops of both grooves is somewhat larger than the length of a plate 8 and the plates 8 thus snap between both said stops 11. Said stops 11 which do not hamper the introduction of the end of plates 8 down to the bottom of groove 5 when locating or removing said plates 8, prevent any sliding of said plates along the lengthwise axis thereof when the plates lie between the stops.

The plates 8 are arranged with that surface bearing the conductors 9 facing the base 1. The springs 10 which are used for mounting the plates are also used for the electric contacting between the conductors 9 mounted on said plates and the conductors 6 mounted on the base 1. Between each plate 8 and the base 1 are thus present at least as many springs 10 as the plate 8 has conductors 9.

Each spring 10 is comprised of a bronze strip bent in the shape of a hair-pin. Both spring legs diverge somewhat when no pressure acts thereon. The end of the one spring leg is bent outwards and will enter a groove 2, the length of said bent portion being long enough to reach the conductor 6 inside said groove 2. The end of the other spring leg is also bent but towards the one spring leg to prevent damaging the conductors 9 on the plates 8, said other leg being used for contacting such a conductor 9. The width of the springs 10 is wide enough to prevent said springs tilting over when they are laid on the base 1 with the outwardly-bent leg inside a groove 2.

The springs ensure an electric contact between a conductor 9 of each plate, that is between a connecting terminal of that component 7 mounted on said plate and one or more conductors 6 mounted on base 1. Said latter conductors 6 connect thus the terminals of two or more components 7 together. It is thus possible to obtain in a fast and easy way an electronic circuit such as for instance the circuit comprising a light control which is shown in the figures. FIG. 4 shows diagrammatically the circuit which is shown in plan in FIG. 1, those portions of the conductors 6 mounted on base 1 and those portions of the conductors 9 mounted on the plates which are not actually used in said circuit being shown in phantom line. It is clear from this FIG. 4 that a limited number of conductors 6 is used to assemble the circuit as considered.

The embodiment as described above can be varied in many ways. Particularly the base does not have to be made completely from insulating material. Said base can be reinforced with non-insulating parts, even metal parts, as long as such parts do not contact the base-mounted conductors. Said base could also omit a groove between both conductor sets.

The rims need not be absolutely integral with the base. Such rims might for example be made of metal.

The base-mounted conductors do not necessarily have to be metal strips glued to the groove bottom. Said conductors could also be rods and/or be arranged freely inside the grooves. In this latter case, the springs ensuring the electrical contact also retain the conductors in position.

Moreover a plurality of conductors lying in the extension of one another can be mounted inside one and the same groove. In this case, the conductors lying inside the same groove can be electrically insulated from one another.

It is also possible to mount on one and the same plate a plurality of components which are always used together, for example pins and a switch.

The plates do not have necessarily to engage one another; they might be spaced from one another.

The conductors mounted on the plates might not be metal strips; they can be comprised of wires. Said wires can be soldered at one end to the plate and at the other end to a terminal of that electronic component which is mounted on the plate.

The rims might be removable or even be part of a removable frame. This allows to firstly mount the plates inside the grooves in said rims and thereafter to mount said rims together with the plates on the base on which the springs have already been arranged.

It must be understood that the invention is in no way limited to the above embodiments and that many changes can be brought therein without departing from the scope of the invention as defined by the appended claims.

I claim:

1. In an electronic experimenting kit, of the kind comprising
   a base;
   a number of conductors mounted on said base, said conductors being electrically insulated relative to one another, extending substantially in parallel relationship with one another and being accessible from the one major face of the base;
   a number of electronic components having connecting terminals;
   a number of plates, each component being so mounted on a plate that the terminals thereof are electrically insulated from one another;
   at least two conductors so mounted on each plate that they are electrically insulated from one another, each electronic component terminal on a plate being electrically connected to one of the conductors mounted on the plate;
   means to removably fasten each plate on the base, and means to provide a disconnectible contact between one base-mounted conductor and one plate-mounted conductor the improvement that the means for fastening the plates to the base comprise;

two rims mounted on the base on each side of the conductor set also mounted on said base and extending substantially in parallel relationship thereto, each such rim having a groove on the side thereof facing the opposite rim, each plate being receivable with both opposite ends thereof in the groove provided in both said opposite rims, the plate length being longer than the spacing between those rim portions which lie farther away from the base than the grooves, but equal at the most to sum of said spacing and the depth of a groove or of the deepest groove when the grooves have different depths, the plate-mounted conductors being so arranged that they cross the base-mounted conductors when said plates are engaged with the end thereof inside the grooves provided in the base rims;

spring-action conductor elements which are completely independent from the base and the plates, said elements being designed for wedging between the base and each plate to press said plates against the rims by moving the plates away from the base and for contacting a plate-mounted conductor and a base-mounted conductor, said elements thus forming said electrical contact between any one of the conductors mounted on a plate and any conductor of at least one conductor set mounted on the base.

2. Electronic experimenting kit as defined in claim 1, in which the base has grooves in one major face thereof, each conductor mounted on said base being mounted in one such groove.

3. Electronic experimenting kit as defined in claim 2, in which the spring-action conducting elements are comprised of bent metal plates, the one plate end being so designed as to contact the conductor mounted inside a base groove and the other end being so designed as to contact a plate-mounted conductor.

4. Electronic experimenting kit as defined in claim 1, in which both rims are provided with a stop arranged in the groove on that groove side farthest away from the base, the spacing between both stops in the opposite grooves being substantially equal to the length of a plate, the groove width being larger than the plate thickness in such a way that said plates are slidable between the stop and the opposite groove wall.

5. Electronic experimenting kit as defined in claim 1, in which the base is of rectangular shape and both the rims provided with a groove and the base-mounted conductors extend over substantially the whole base length.

* * * * *